United States Patent [19]
Kim et al.

[11] Patent Number: 5,535,171
[45] Date of Patent: Jul. 9, 1996

[54] DATA OUTPUT BUFFER OF A SEMICONDUCTER MEMORY DEVICE

[75] Inventors: Chull-Soo Kim, Suwon; Hyun-Soon Jang, Seoul, both of Rep. of Korea

[73] Assignee: Samsung Electronics Co., Ltd., Suwon, Rep. of Korea

[21] Appl. No.: 383,767

[22] Filed: Feb. 3, 1995

[30] Foreign Application Priority Data

Feb. 4, 1994 [KR] Rep. of Korea ............... 2089/1994

[51] Int. Cl.⁶ ........................................... G11C 8/00
[52] U.S. Cl. ........................... 365/233; 365/189.05
[58] Field of Search ..................... 365/233, 189.05, 365/189.11

[56] References Cited

U.S. PATENT DOCUMENTS

| | | | |
|---|---|---|---|
| 5,384,735 | 1/1995 | Park | 365/189.05 |
| 5,402,388 | 3/1995 | Wojcicki | 365/189.05 |
| 5,424,983 | 6/1995 | Wojcicki | 365/189.05 |
| 5,430,688 | 7/1995 | Takasugi | 365/189.05 |

*Primary Examiner*—A. Zarabian
*Attorney, Agent, or Firm*—Cushman Darby & Cushman

[57] ABSTRACT

A data output buffer of a semiconductor memory device using a clock having a fixed period from outside. The data output buffer has a data input part controlled and synchronized with a clock, for inputting data; a data latch device for latching data output through the data input part to thereby set up a predetermined delay time; a control signal input part controlled by the clock, for inputting a control signal; a latch controller for latching the control signal output through the control signal input part during a given time; a data output driver for receiving an output signal from the data latch device, the data output driver being controlled by the output signal of the latch controller; and an output device connected to the data output driver, for providing the data.

16 Claims, 4 Drawing Sheets

DATA OUTPUT BUFFER OF A SEMICONDUCTER MEMORY DEVICE

BACKGROUND OF THE INVENTION

The present invention relates to a semiconductor memory device, and more particularly to a data output buffer of a semiconductor memory device using an external clock having a fixed period from outside.

In general, since a semiconductor memory device such as a DRAM (Dynamic Random Access Memory) basically inputs a row address strobe signal $\overline{RAS}$ generated externally of the chip, it is possible to perform a data read operation or a data write operation. Namely, after the row address strobe signal $\overline{RAS}$ had been enabled and a predetermined time passes, if a column address strobe signal $\overline{CAS}$ is output, the period when data is output from the chip is constant.

FIG. 1 shows a data output buffer of a semiconductor memory device. The semiconductor memory device shown in FIG. 1 includes an inverter 35 for receiving external clock CLK input from the out of the chip, an inverter 40 for again inverting the output signal of the inverter 35, and transfer gates 5 and 55 controlled by the output signals of the inverters 35 and 40. Data DO and $\overline{DO}$ are input to the transfer gates 5 and 55 from a sense amplifier (not shown). Each of output signals of the transfer gates 5 and 55 of data input 90 is temporarily stored in latches 85 and 97 and is then transferred to drivers 95 and 100. A pull-up transistor 25 of the driver 95 of the data DO, uses as power a boost voltage VPP boosted within the semiconductor memory device so that a pull-up transistor 30 for output enables a power supply voltage VCC to be supplied to a data output node N1 by raising the potential of the gate terminal of pull-up transistor 30 above VCC voltage.

FIG. 2 is a timing diagram of the FIG. 1 circuit. In FIG. 2, the system clock CLK provided from the outside is successively generated. After the column address strobe signal $\overline{CAS}$ is enabled, a second clock is enabled to a logic "high" state from a logic "low" state and a data output buffer enable signal $\phi$TRST is thus enabled to the logic "high" state. Thereby, a first data is output and the data output buffer is thus enabled. Since the time required in enabling the data output buffer enable signal $\phi$TRST is delayed, a delay time exits before the data output buffer is enabled, the result being that the speed of the data output operation becomes low. However, since the data output buffer enable signal $\phi$TRST is maintained at the logic "high" state, data following a second data correspond to clocks following a fourth clock, respectively and then are generated.

In the meantime, in the data output buffer of the semiconductor memory device shown in FIG. 1, if the output buffer enable signal $\phi$TRST is varied, the variation should affect an output operation of the effective data.

In the semiconductor memory device operating in synchronization with the system clock having an externally fixed period the point of time for enabling the data output buffer is important to properly output the effective data from the data output buffer. Further, in a system operable according to the frequency of the system clock, the period of the clock is changed according to the frequency thereof to thereby enable the data output buffer enable signal $\phi$TRST.

SUMMARY OF THE INVENTION

It is therefore object of the present invention to provide a semiconductor memory device capable of preventing ineffective data from being output.

It is another object of the present invention to provide a semiconductor memory device capable of performing a stable operation by improving the operational speed thereof.

In response to the clock having an externally fixed period, the semiconductor memory device has a data latch device for latching data in synchronization with the clock set up a predetermined delay time. A latch controller latches a control signal enabled in synchronization with the clock during a given time and a data output driver receives an output signal from the data latch device. The data output driver is controlled by the output signal of the latch controller and an output device connected to the data output driver outputs the data.

According to the present invention, the time when the node N2 is set to the logic "high" state is precisely set to the time when the data is output. As a result, ineffective data is prevented from being output and especially, a component tSAC, i.e., the time till the effective data is output after the clock is generated, is satisfied, the component tSAC being important to the memory device operated by being synchronized with the clock having a fixed period.

BRIEF DESCRIPTION OF THE DRAWINGS

The above and other objects, advantages and features of the present invention will be more apparent from the following detailed description taken with the attached drawings in which.

DETAILED DESCRIPTION OF THE PREFERRED EMBODIMENT

Figure 1:
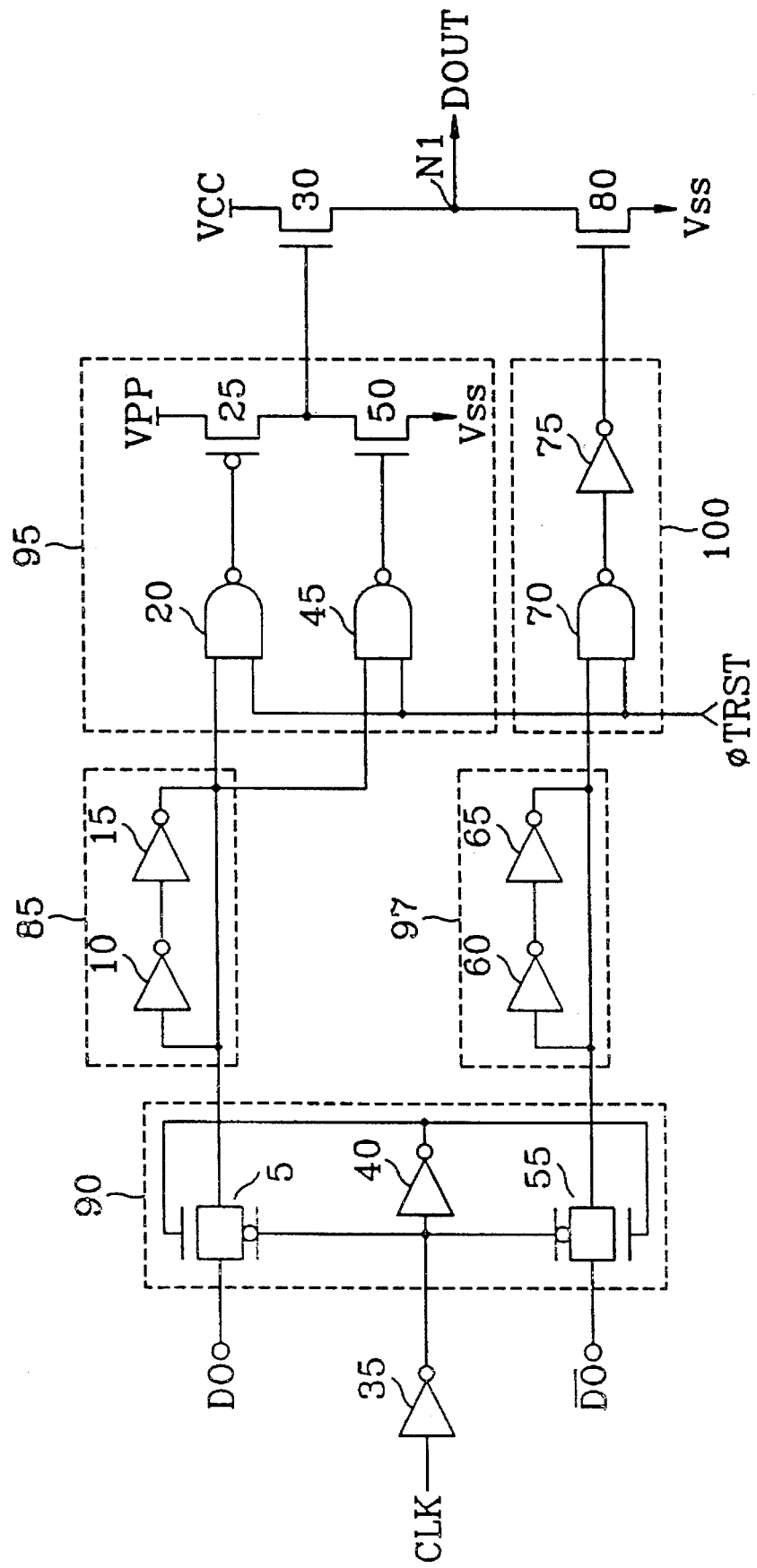
FIG. 1 shows a data output buffer of a semiconductor memory device of a conventional art.
Figure 2:
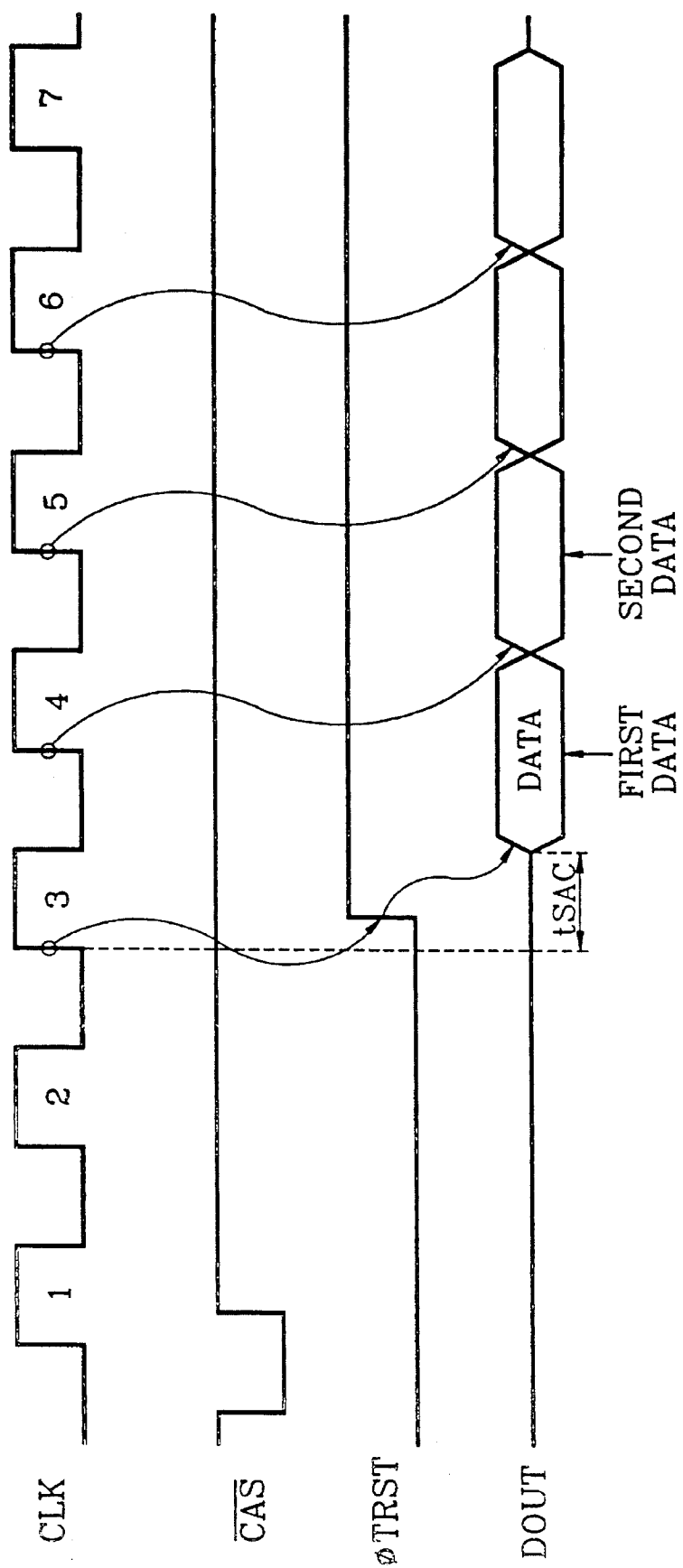
FIG. 2 is a timing view according to FIG. 1.

In the following description, components of the present invention that are the same as those of the conventional art, reference numerals.

Figure 3:
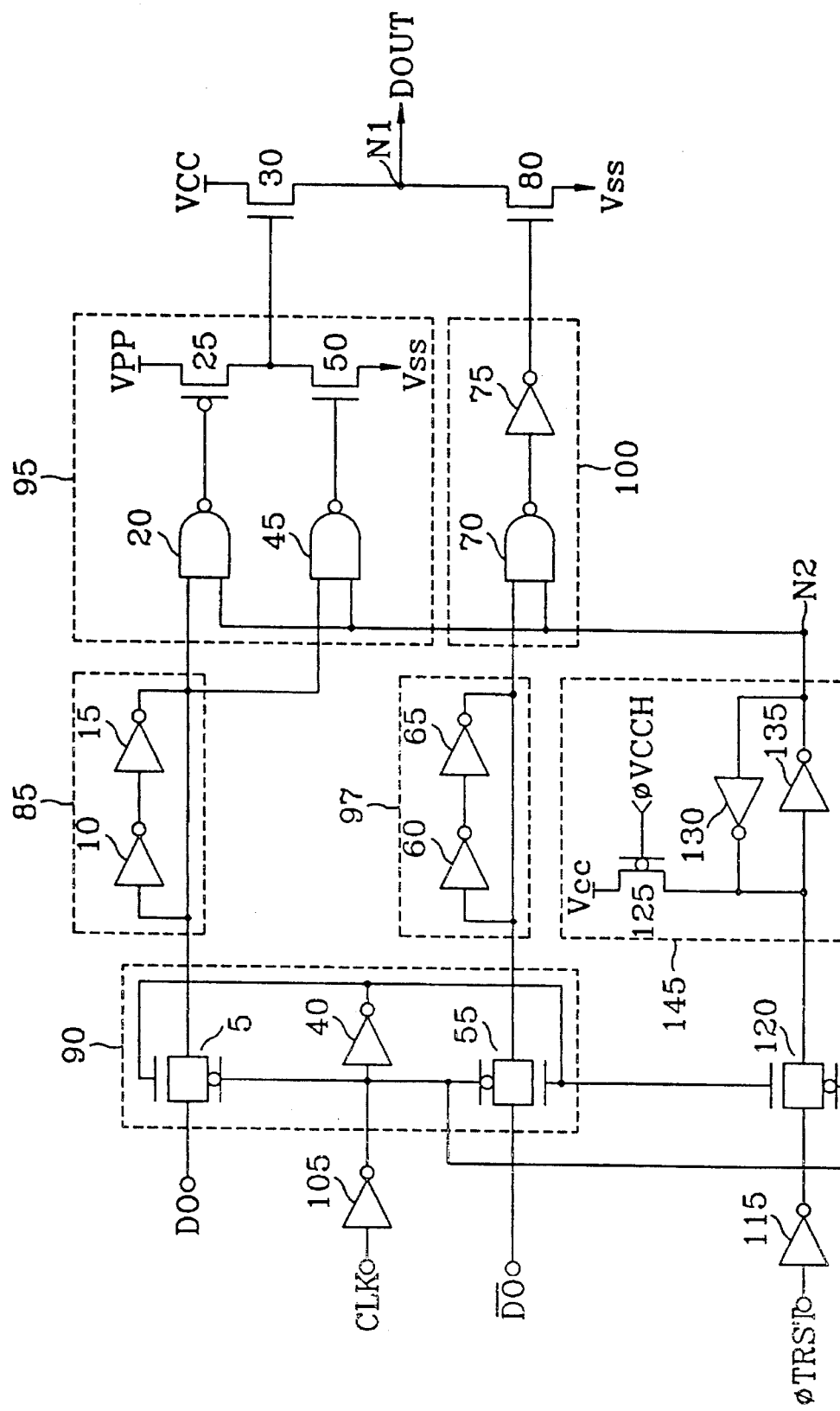
FIG. 3 shows a data output buffer of a semiconductor memory device of the present invention.

FIG. 3 shows a data output buffer of a semiconductor memory device of the present invention. The semiconductor memory device has an inverter 105 for inputting a clock signal CLK provided from outside, an inverter 40 for inverting an output signal of the inverter 105, and transfer gates 5 and 55 controlled by the output signals of the inverters 105 and 40. Data DO and $\overline{DO}$ are input to the transfer gates 5 and 55 from a sense amplifier (not shown). Each of output signals of the transfer gates 5 and 55 of a data input part 90 is temporarily stored in latches 85 and 97 and is then transferred to drivers 95 and 100 of the data DO and $\overline{DO}$. That is, in synchronization with the clock CLK provided from the outside, the data is stored in the latch parts 85 and 97. After a predetermined delay time, the stored data is transferred to the drivers 95 and 100. A pull-up transistor 25 of the driver 95 uses a boost voltage VPP boosted within the semiconductor memory device so that a power supply voltage VCC to be supplied to a data output node N1 by raising a potential of the gate terminal of transistor 30 above Vcc voltage. Such data output drivers 95 and 100 input the output signals from the latches parts 85 and 97 and drive the output signals in response to a signal set up in a node N1.

The data output buffer shown in FIG. 3 inputs a data output buffer enable signal $\phi$TRST generated in synchronization with the external clock CLK input. Further, the data output buffer comprises a transfer gate 120 controlled by the output signals of the inverters 105 and 40, and a latch controller part 145 composed of inverters 130 and 135 for latching an output signal of the transfer gate 120, a PMOS transistor 125 which inputs the power supply voltage VCC at its source terminal and inputs a power up voltage φVCCH at its gate terminal.

With reference to a timing diagram of FIG. 4, the data output buffer of the semiconductor memory device shown in FIG. 3 will be explained in detail hereinafter. First, after a column address strobe signal $\overline{CAS}$ had been enabled and a predetermined time elapses, the effective data DO and $\overline{DO}$ are input to the transfer gates 5 and 55 of the data transfer input 90. The clock CLK is input in the logic "high" state and the transfer gates 5 and 55 are thus turned on. The output signals of the transfer gates 5 and 55 are thus temporarily stored in the latches 85 and 97 and are then transferred to NAND gates 20, 45, and 70 of the drivers 95 and 100 of the data DO and $\overline{DO}$.

In the meantime, the power up voltage φVCCH input to the gate terminal of the PMOS transistor 125 of the latch controller 145 is maintained at the logic "low" state in an initial operation. Thereby, the PMOS transistor 125 is therefore turned on and the potential at the node N2 is set up at logic "low" state so that the drivers 95 and 100 of the data DO and $\overline{DO}$ can be set up in a inactivation state in the initial operation. Moreover, after the operation began and the time went by, the power up voltage φVCCH is set up at the logic "high" state and the PMOS transistor 125 is thus turned off. Thereby, the potential at the node N2 is set up in response to the data output buffer enable signal φTRST.

Figure 4:
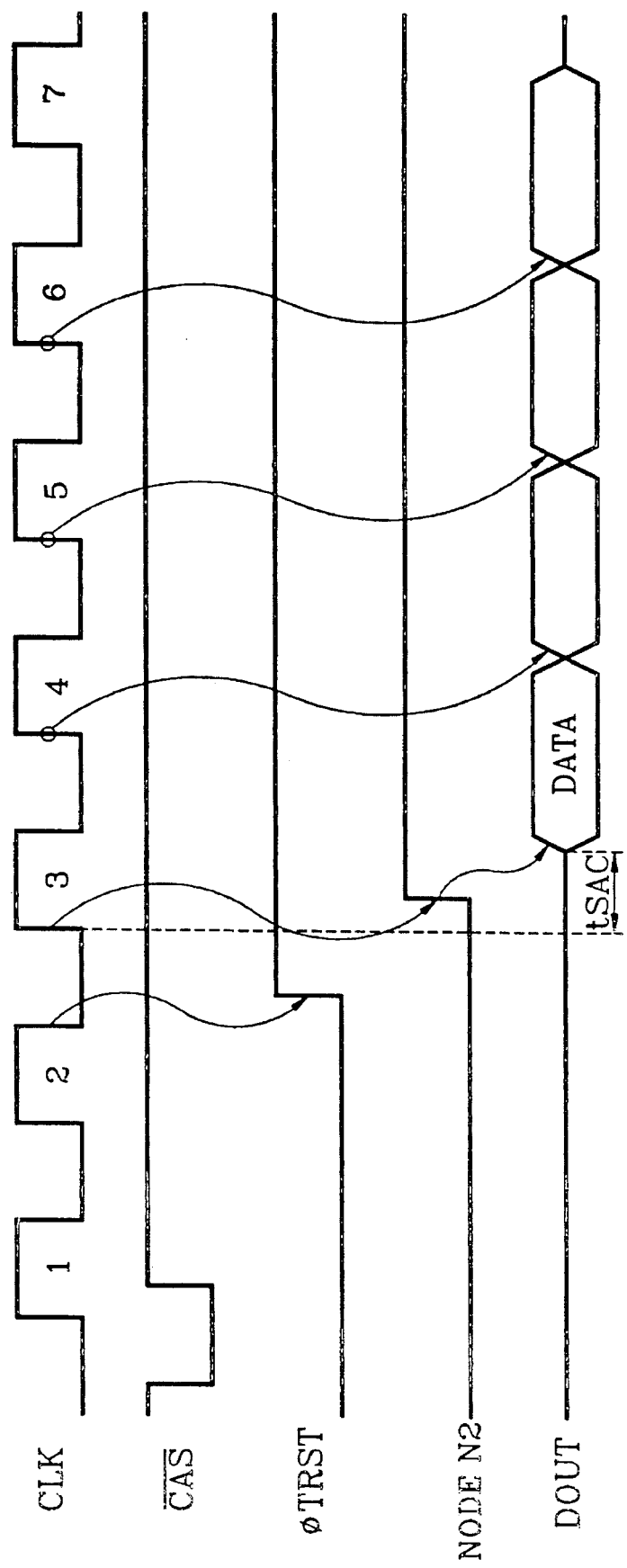
FIG. 4 is a timing view according to FIG. 3.

As shown in FIG. 4, after the column address strobe signal $\overline{CAS}$ is enabled and in synchronization with a falling edge of a first clock, pulse (pulse 2 in FIG. 4) the data output buffer enable signal φTRST is enabled at the logic "high" state. After the column address strobe signal $\overline{CAS}$ is enabled, if a second clock pulse (pulse 3 in FIG. 4 is enabled to the logic "high" state from the logic "low" state, the transfer gate 120 is turned on and, at the same time, data output buffer enable signal φTRST is temporarily stored in the latch controller 145. Thereafter, the signal set up at node N2 is maintained at the logic "high" state. The data output buffer enable signal φTRST is synchronized and latched by a clock preceding the clock which fetches the data according to the frequency of the clock.

Therefore, the signal set up at node N2 is input to each of the NAND gates 20, 45, and 70 and the drivers 95 and 100, which corresponds to data DO and $\overline{DO}$ respectively are operated, so that the effective data is output.

As shown in FIGS. 3 and 4, in the present invention, the data output buffer enable signal φTRST is changed to the logic "high" state when the second clock pulse (pulse 2 in FIG. 4) is changed to the logic "low" state from the logic "high" state. The data output buffer enable signal φTRST set to the logic "high" state is transferred to the transfer gate 120 of the data output buffer. As shown in FIG. 4, the transfer gate 120 is turned on when a third clock pulse (pulse 3, in FIG. 4) is changed to the logic "high" state from the logic "low" state. Thereby, the data output buffer enable signal φTRST is latched by the latch controller part 145 of FIG. 3 and at the same time, the effective data is output. Thus, the speed of the data output operation of the data output buffer according to the present invention is faster than that of the conventional data output buffer.

By synchronizing the effective data DO and $\overline{DO}$, and the data output buffer enable signal φTRST with the same clock CLK, it is possible to prevent the ineffective data from being output. Further, even if the data output buffer enable signal φTRST is changed to a logic "low" state from a logic "high" state in the logic interval between the third clock and the fourth clock, the clock CLK can not turn on the transfer gate 120 of FIG. 3 during a logic "low" state. Therefore, the previously latched logic "high" state of the node N2 previously latched, is not changed and the change in φTRST during this interval will have no influence on the output of the effective data.

Thus, in the semiconductor memory device of the present invention, it is possible to prevent the ineffective data from being output and to improve the operational speed thereof, so that there is efficiency in that a stable operation can be performed.

What is claimed is:

1. A semiconductor memory device operating in response to an external clock having a fixed period, comprising:

a data latch which latches input data synchronized by said clock, said data latch outputting latched data;

a latch controller which includes a control latch that latches a control signal in synchronization with said clock, said control latch outputting an output control signal;

a data output driver which receives said latched data from said data latch and outputs said latched data as output data, said data output driver being controlled in accordance with said output control signal; and an output connected to said data output driver for outputting said output data.

2. A semiconductor memory device according to claim 1, wherein said output control signal is synchronized with a clock pulse which precedes a data fetch clock pulse so that said output control signal is latched into said control latch prior to a data fetch operation.

3. A semiconductor memory device according to claim 1, wherein said latch controller includes a latch control transistor which has a latch control gate connected to said system clock so that said system clock synchronizes latching of said control signal through said latch control transistor to said control latch.

4. A semiconductor memory device according to claim 3, wherein said output control signal is latched into said latch control with a clock pulse which precedes a data fetch clock pulse and which is applied to said latch control gate of said latch control transistor so that said output control signal is latched into said control latch prior to a data fetch operation.

5. A semiconductor memory device according to claim 2 wherein said clock pulse also latches said input data into said data latch.

6. A semiconductor memory device according to claim 4 wherein said clock pulse also latches said input data into said data latch.

7. A semiconductor memory device according to claim 2, wherein said output control signal is a data output buffer enable signal.

8. A semiconductor memory device according to claim 1, wherein said latch controller is further controlled by a power up signal which maintains said control latch in an initial condition.

9. A data output buffer of a semiconductor memory device which operates in response to an external clock having a fixed period, comprising:

a data input circuit which receives input data, said data input circuit outputting said input data as synchronized input data in synchronization with said clock;

a data latch for latching said synchronized input data, said data latch outputting latch data;

a latch controller which includes a control latch that latches a control signal in synchronization with said clock, said control latch outputting an output control signal;

a data output driver which receives said latched data from said data latch, said data output driver controlling output of said latched data as output data using said output control signal; and an output connected to said data output driver for outputting said output data.

10. A data output buffer according to claim 9, wherein said output control signal is synchronized with a clock pulse which precedes a data fetch clock pulse so that said output control signal is latched into said control latch prior to a data fetch operation.

11. A data output buffer according to claim 9, wherein said latch controller includes a latch control transistor which has a latch control gate connected to said system clock so that said system clock synchronizes latching of said control signal through said latch control transistor to said control latch.

12. A data output buffer according to claim 11, wherein said output control signal is latched into said latch control with a clock pulse which precedes a data fetch clock pulse and which is applied to said latch control gate of said latch control transistor so that said output control signal is latched into said control latch prior to a data fetch operation.

13. A data output buffer according to claim 10 wherein said clock pulse also latches said input data into said data latch.

14. A data output buffer according to claim 12 wherein said clock pulse also latches said input data into said data latch.

15. A data output buffer according to claim 10, wherein said output control signal is a data output buffer enable signal.

16. A data output buffer according to claim 9, wherein said latch controller is further controlled by a power up signal which maintains said control latch in an initial condition.

* * * * *

UNITED STATES PATENT AND TRADEMARK OFFICE
CERTIFICATE OF CORRECTION

Page 1 of 1

| | |
|---|---|
| PATENT NO. | : 5,535,171 |
| APPLICATION NO. | : 08/383767 |
| DATED | : July 9, 1996 |
| INVENTOR(S) | : Chull-Soo Kim and Hyun-Soon Jang |

It is certified that error appears in the above-identified patent and that said Letters Patent is hereby corrected as shown below:

Column 4, line 20, before the word "clock"
Insert --external--

Column 4, line 23, before the word "clock"
Insert --external--

Column 4, line 39, before the phrase "clock so that"
Delete "system" and insert --external--

Column 4, line 39, before the phrase "clock synchronizes latching"
Delete "system" and insert --external--

Column 4, line 66, before the word "clock"
Insert --external--

Column 5, line 2, after the word "outputting"
Delete "latch" and insert --latched--

Column 5, line 5, before the word "clock"
Insert --external--

Column 5, line 20, after the word "said"
Delete "system" and insert --external--

Column 5, line 21, before the phrase "clock synchronizes latching"
Delete "system" and insert --external--

Signed and Sealed this
Seventeenth Day of January, 2012

David J. Kappos
*Director of the United States Patent and Trademark Office*